United States Patent
Ao et al.

(10) Patent No.: US 9,510,448 B2
(45) Date of Patent: Nov. 29, 2016

(54) MAXIMIZING SURFACE AREA OF SURFACE MOUNT CONTACT PADS OF CIRCUIT BOARD ALSO HAVING VIA CONTACT PADS

(71) Applicant: LENOVO ENTERPRISE SOLUTIONS (SINGAPORE) PTE. LTD., New Tech Park (SG)

(72) Inventors: Eric R. Ao, Nepean (CA); Stephen J. Flint, Ottawa (CA); Michael W. J. Hogan, Kanata (CA); Shannon D. McGale, Ottawa (CA); Rodolfo B. Salinas, Nepean (CA)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 67 days.

(21) Appl. No.: 14/473,509

(22) Filed: Aug. 29, 2014

(65) Prior Publication Data

US 2016/0066424 A1 Mar. 3, 2016

(51) Int. Cl.
| | |
|---|---|
| H05K 7/00 | (2006.01) |
| H05K 1/16 | (2006.01) |
| H05K 1/11 | (2006.01) |
| H05K 7/10 | (2006.01) |
| H01K 3/10 | (2006.01) |
| H05K 1/18 | (2006.01) |
| H05K 3/34 | (2006.01) |

(52) U.S. Cl.
CPC ............... *H05K 1/113* (2013.01); *H05K 1/111* (2013.01); *H05K 1/116* (2013.01); *H05K 1/181* (2013.01); *H05K 3/3415* (2013.01); *H05K 2201/0939* (2013.01); *H05K 2201/09609* (2013.01)

(58) Field of Classification Search
CPC .... H05K 1/113; H05K 3/4038; H05K 1/111; H05K 1/116; H05K 3/3415; H05K 2201/0939; H05K 2201/09609
USPC .......................... 174/260, 262; 361/767, 777
See application file for complete search history.

(56) References Cited

U.S. PATENT DOCUMENTS

| | | | |
|---|---|---|---|
| 4,853,826 A | 8/1989 | Hernandez | |
| 6,404,649 B1 | 6/2002 | Drake | |
| 7,323,787 B2 | 1/2008 | Chan | |
| 7,349,223 B2 | 3/2008 | Haemer | |
| 7,602,615 B2 | 10/2009 | Chan | |
| 7,906,734 B2 * | 3/2011 | Del Rosario | H05K 1/023 174/261 |
| 8,633,398 B2 | 1/2014 | Carpenter | |
| 2011/0090662 A1 | 4/2011 | Jang | |
| 2012/0168216 A1 | 7/2012 | Chan | |

* cited by examiner

*Primary Examiner* — Sherman Ng
(74) *Attorney, Agent, or Firm* — Katherine Brown

(57) ABSTRACT

A circuit board has a first side and a second side opposite thereto. The board includes vias extending through the substrate from the first side to the second side, and via contact pads on the second side, each of which surrounds a corresponding via. The board includes a pair of surface mount contact pads on the second side. Each surface mount contact pad has a surface area and edges, each of which can have a shape to maximize the surface area while maintaining predetermined minimum separation distances. Each edge except one or more edges that are opposite another surface mount contact pad have a curved shape, and each edge opposite another surface mount contact pad have a linear shape. Curved edges adjacently opposite corresponding via contact pads can have curved shapes can have concave shapes, and curved edges not adjacently opposite via contact pads can have convex shapes.

20 Claims, 4 Drawing Sheets

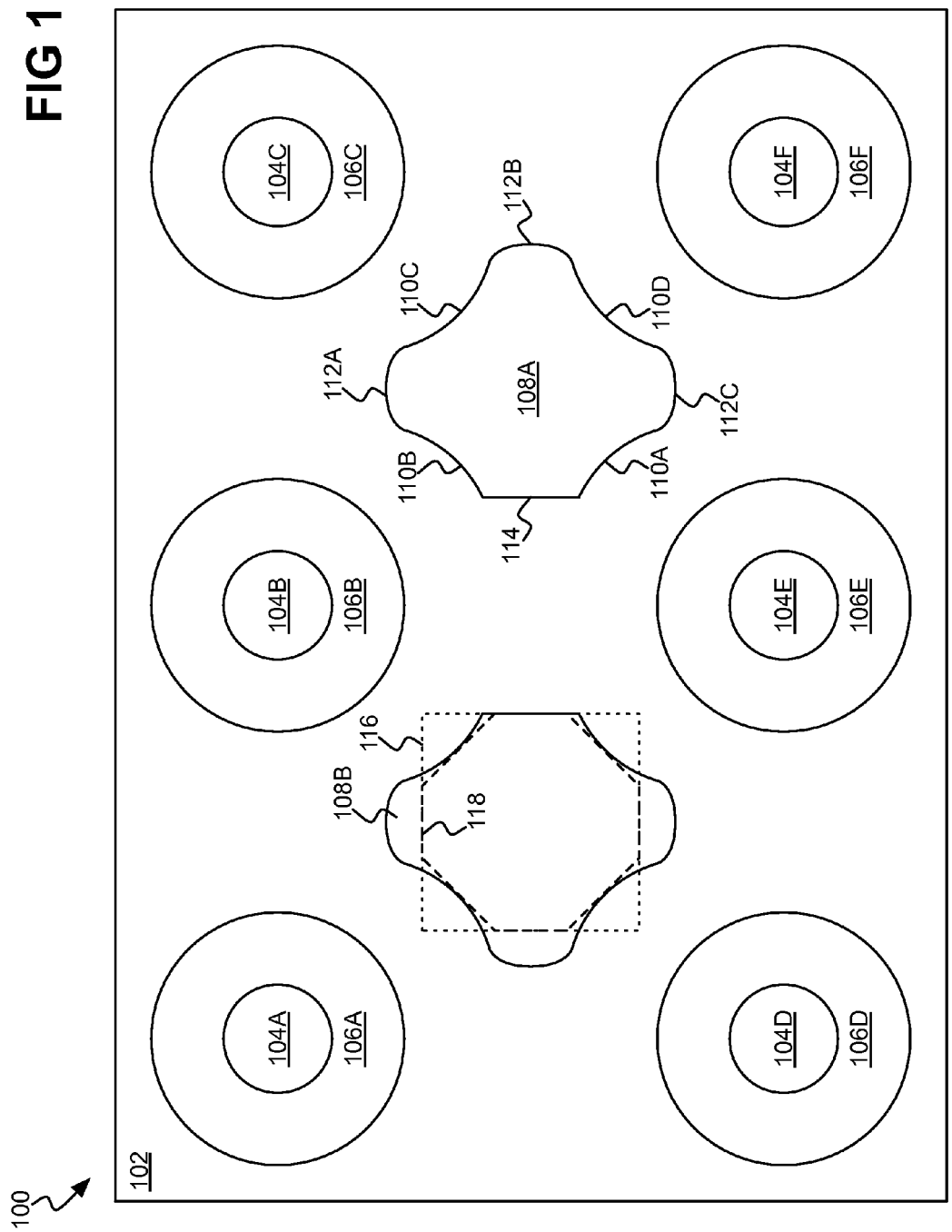

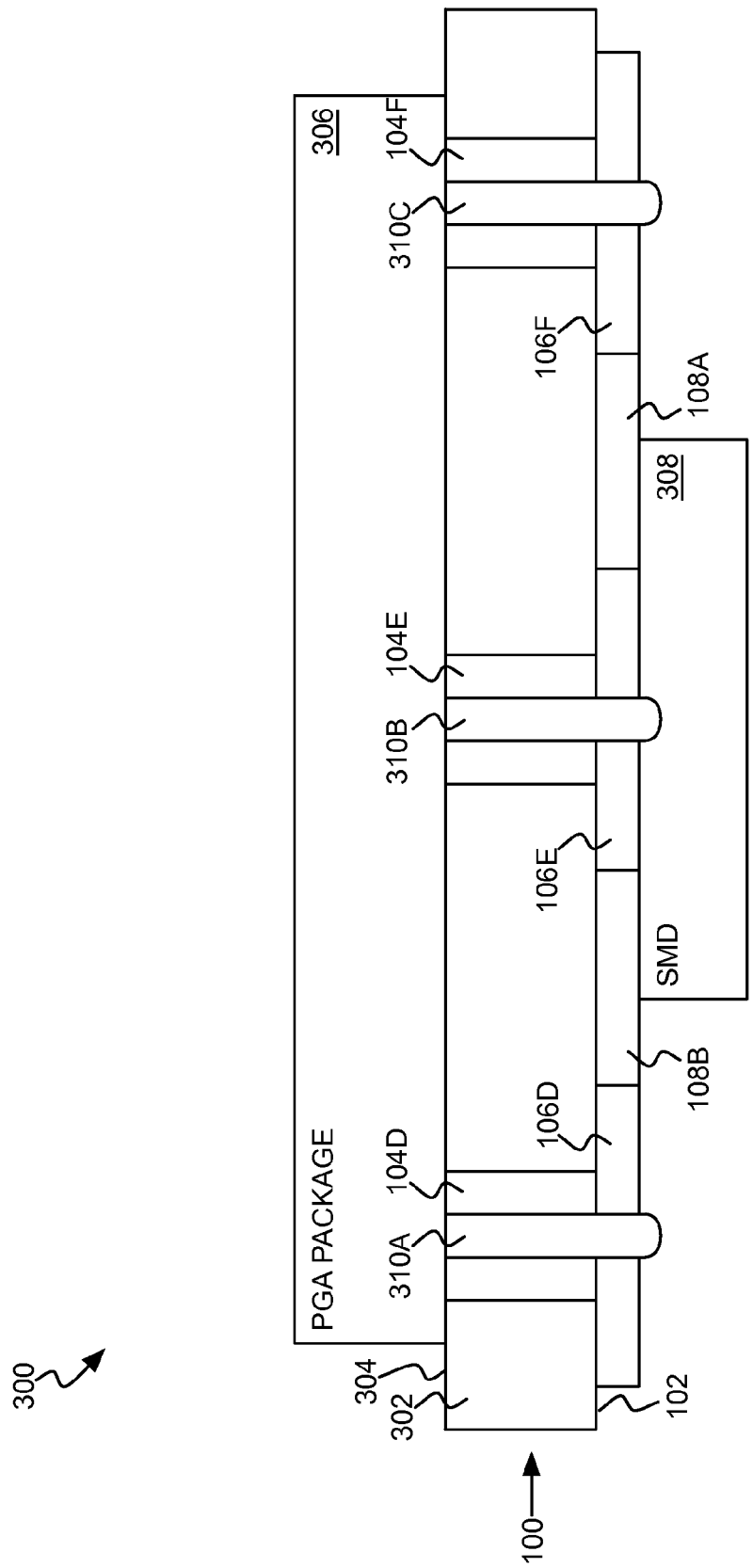

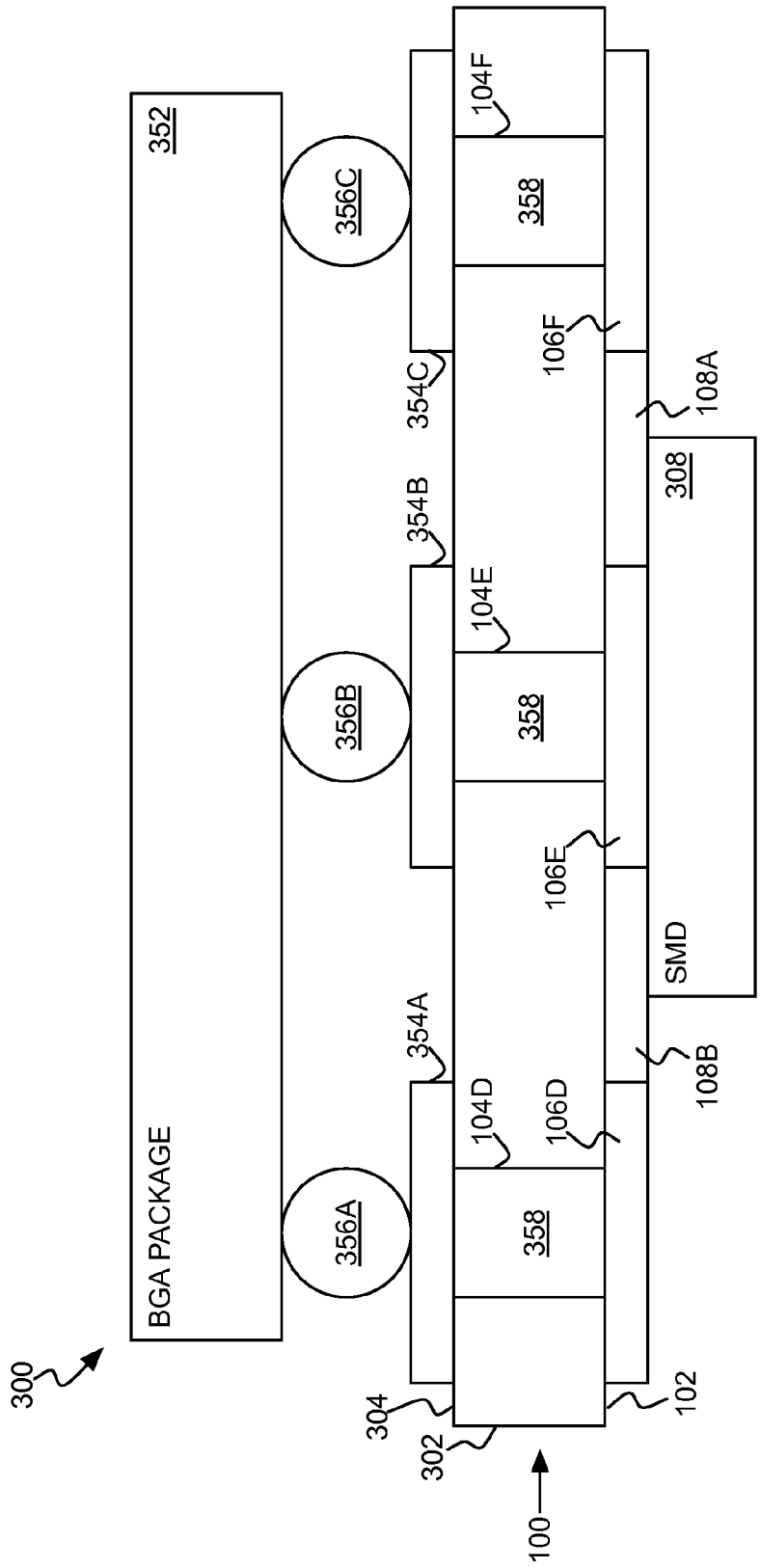

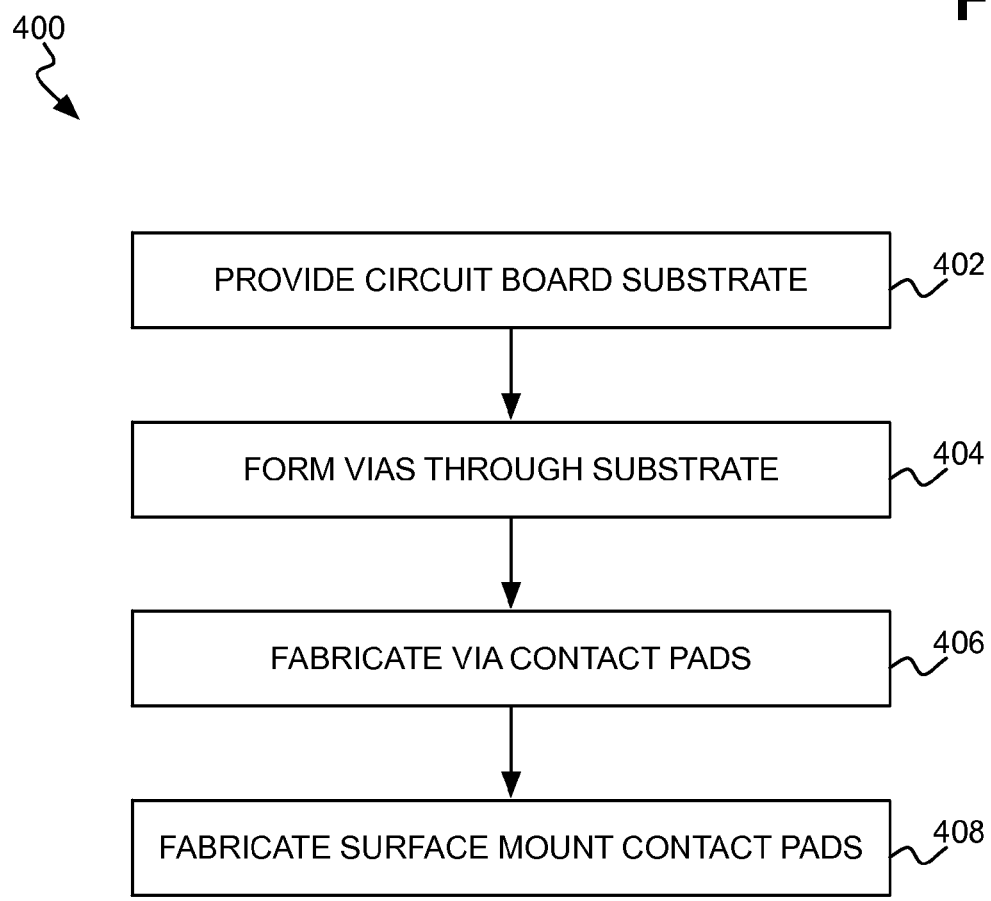

MAXIMIZING SURFACE AREA OF SURFACE MOUNT CONTACT PADS OF CIRCUIT BOARD ALSO HAVING VIA CONTACT PADS

BACKGROUND

Electronic devices, such as computing devices, typically include a circuit board, like a printed circuit board, on which a number of electrical components are mounted. Electrical components can be mounted on circuit boards in a number of different ways. In one approach, the components are surface-mount components, and are mounted, such as via soldering, to conductive contact or landing pads formed on a circuit board. In another approach, the electrical components have pins. The pins are fitted through corresponding via holes formed within a circuit board. The pins are then soldered to conductive contact pads surrounding the via holes.

SUMMARY

An example circuit board includes a substrate having a first side and a second side opposite the first side. The circuit board includes vias extending through the substrate from the first side to the second side, and via contact pads on the second side. Each via contact pad surrounds a corresponding via. The circuit board includes a pair of surface mount contact pads on the second side. Each surface mount contact pad has a surface area and one or more first edges adjacently opposite corresponding via contact pads. Each first edge has a shape to maximize the surface area while maintaining a first predetermined minimum distance to a closet via contact pad.

An example method includes providing a substrate of a circuit board. The substrate has a first side and a second side opposite the first side. The method includes forming vias extending through the substrate from the first side to the second side. The method includes fabricating via contact pads on the second side. Each via contact pad surrounds a corresponding via. The method includes fabricating a pair of surface mount contact pads on the second side. Each surface mount contact pad includes first edges, second edges, and a third edges. The first edges are adjacently opposite corresponding via contact pads and have curved shapes. The second edges are not adjacently opposite the corresponding via contact pads and have curved shapes. The third edge is opposite the other surface mount contact pad and has a linear shape.

An example electronic device includes a substrate having a first side and a second side opposite the first side. The device includes vias extending through the substrate from the first side to the second side. The device includes via contact pads on the second side. Each via contact pad surrounds a corresponding via. The device includes surface mount contact pads on the second side. Each surface mount contact pad has edges. Each edge except one or more edges that are opposite another surface mount contact pad have a curved shape, and each edge opposite another surface mount contact pad have a linear shape. The device includes one or more electrical components disposed on one or more of the first side and the second side. The device includes one or more surface mount electrical components disposed on the surface mount contact pads on the second side.

BRIEF DESCRIPTION OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIG. 1 is a diagram of a portion of an example circuit board in which surface mount contact pads have edges shaped to maximize pad surface area while satisfying specified minimum distances.

FIG. 2 is a diagram of a portion of an example electronic device including a pin grid array (PGA) package and the example circuit board of FIG. 1.

FIG. 3 is a diagram a portion of an example electronic device including a ball grid array (BGA) package and the example circuit board of FIG. 1.

FIG. 4 is a flowchart of a method for manufacturing the example circuit board of FIG. 1.

DETAILED DESCRIPTION

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure.

As noted in the background section, electrical components can be mounted to circuit boards of electronic devices in a variety of different ways. Pin grid array (PGA) packages are electrical components such as integrated circuits that have a large number of relatively dense pins that are inserted within corresponding vias of circuit boards. Ball grid array (BGA) packages are similarly electrical components such as integrated circuits that have a large number of relatively dense contact pads that are mounted on corresponding contact pads of circuit boards. Other electrical components may have to be located as close as possible to various pins of the PGA packages, and to various contact pads of the BGA packages. For example, decoupling capacitors may have to be placed close to power and ground pins or pads to effectively perform high frequency noise decoupling. However, this can be difficult to accomplish with the increasing density of PGA and BGA packages. Specifically, it can be difficult to place surface mount contact pads of sufficient size for surface mounting decoupling capacitors close to via contact pads surrounding the vias through which power and ground pins of PGA packages extend, and that conductively connect to corresponding power and ground pads of BGA packages.

Limited solutions including altering the geometries of the surface mount contact pads from the more typical square or rectangular shaped contact pads. However, altering the shapes of the contact pads generally results in a reduction of their surface area. In turn, the reduction of surface mount contact pad surface area can increase inductance, resulting in reduced noise decoupling capability of electrical components like decoupling capacitors.

Disclosed herein are techniques for locating surface mount contact pads close to via contact pads surrounding corresponding vias on a circuit board, while maximizing as much as possible the surface areas of the surface mount contact pads. Each surface mount contact pad has a surface area and one or more edges adjacently opposite corresponding via contact pads. Each edge has a shape that can maximize surface area while maintaining a specified minimum distance to a closest via contact pad. Such edges can have a curved shape, like a concave or partially circular shape.

Other edges of each surface mount contact pad that are not adjacently opposite the via contact pads may also have a shape that can maximize surface area while maintaining the specified minimum distance to the via contact pads. These edges may also have a curved shape, like a concave or partially circular shape. Finally, the edge of each contact pad that is directly opposite another surface mount contact pad may similarly have a shape that can maximize surface area while maintaining a specified minimum distance to the other surface mount contact pad, such as a linear shape.

The resulting surface mount contact pads may be substantially octagonal in shape. However, of the eight edges, just one has a linear shape (i.e., just one edge is straight), specifically the edge facing another surface mount contact pad. Every other edge may be curved, where edges that are opposite via contact pads are concave or inwardly partially circular, and edges that are not opposite via contact pads are convex or outwardly partially circular. In these ways, surface areas of surface mount contact pads are maximized, while simultaneously permitting close location to via contact pads accordance to specified minimum distances.

FIG. 1 shows a portion of an example circuit board 100, such as a printed circuit board. The circuit board 100 has a side 102 that is specifically shown in FIG. 1, which may be the back, bottom, or secondary side of the board 100. The circuit board 100 includes a number of vias 104A, 104B, 104C, 104D, 104E, and 104F, collectively referred to as the vias 104, and which are through holes extending through a thickness of the board 100. Surrounding the vias 104 are corresponding via contact pads 106A, 106B, 106C, 106D, 106E, and 106F, collectively referred to as the via contact pads 106, and which are of a conductive material, such as copper.

The circuit board 100 includes at least a pair of surface mount contact pads 108A and 108B, collectively referred to as the surface mount contact pads 108. The surface mount contact pad 108A is representatively discussed herein. The surface mount contact pad 108A can be substantially and generally octagonal in shape. As such, the contact pad 108A of FIG. 1 has eight edges, including edges 110A, 110B, 110C, and 110D, collectively referred to as the edges 110; edges 112A, 112B, and 112C, collectively referred to as the edges 112; and an edge 114.

The edges 110 are each adjacently opposite a corresponding closest via contact pad 106. Specifically, the edge 110A is adjacently opposite the via contact pad 106E, the edge 110B is opposite the via contact pad 106B, the edge 110C is opposite the via contact pad 106C, and the edge 110D is opposite the via contact pad 106F. The edges 110 each have a shape that is curved and more specifically concave and/or partially circular. The distance between each point of each edge 110 and the corresponding closest via contact pad 106 is not less than and can be identical to a specified minimum distance, which is the minimum distance permitted between any via contact pad 106 and any surface mount contact pad 108. That is, for each point of each edge 110, a line drawn from the point and extending to the corresponding closest point on via contact pad 106 is not less than and can be identical to this specified minimum distance.

The edges 112 are not adjacently opposite corresponding via contact pads 106. For example, the edge 112A points upwards where there is no via contact pad 106. The edges 112 each have a shape that is curved and more specifically convex and/or partially circular. The edge 114 is opposite the other surface mount contact pad 108B. The edge 114 has a linear shape. The distance between the edge 114 and the surface mount contact pad 108B is not less than and can be identical to a different specified minimum distance, which is the minimum distance permitted between a pair of surface mount contact pads 108 to which ends of an electrical component are to be mounted, to avoid electrical component drift during the reflow soldering process.

In general, the curved shapes of the edges 110 and 112, and the linear shape of the edge 114, of the surface mount contact pad 108A maximizes the surface area of the contact pad 108A while ensuring the specified minimum distances between the contact pad 108A and the via contact pads 106 and between the contact pad 108A and the other surface mount contact pad 108B are obeyed. This advantageous technical effect is more clearly evident by the superimposition of a conventional surface mount contact pad 116 and the less advantageous surface mount contact pad 118, via dotted and dashed lines respectively, on the surface mount contact pad 108B. The contact pad 116 is square in shape and may have more surface area than the contact pad 108B, but does not adhere to the specified minimum distances between it and the via contact pads 106. The contact pad 118 is truly octagonal in shape (i.e., with eight linear edges) and adheres to the specified minimum distances between it and the via contact pads 106, but has less surface area than the contact pad 108B.

In the example of FIG. 1, each surface mount contact pad 108 is located in an area bounded at its corners by four of the vias 104 organized in a two via-by-two via grid. However, in other cases, a surface mount contact pad 108 may be such that it is not disposed in the middle of four vias 104. In such cases, the surface mount contact pad 108 may not have a corresponding edge 110. For example, if the via 104C were not present, then the edge 110C may not be present, such that the edges 112A and 112B meet in a sharp or rounded corner. There thus may be at most four edges 110 corresponding to four vias 104. Stated another way, the number of edges 110 may correspond to the number of vias 104 closest to the surface mount contact pad 108 in question.

FIG. 2 shows an example of a portion of an electronic device 300 including the circuit board 100. The device 300 is depicted in FIG. 2 as a front cross-sectional view across a plane intersecting the vias 104D, 104E, and 104F. The circuit board 100 includes a non-conductive substrate 302 that has a side 304 and the side 102 opposite the side 304. Visible in FIG. 2 are, besides the vias 104D, 104E, and 104F, the via contact pads 106D, 106E, and 106F, and the surface mount contact pads 108.

The vias 104 extend through the substrate 302 from the side 304 to the side 102. As such, the vias 104 are receptive to insertion of pins 310 of a corresponding PGA package 306, or another electrical component having pins, at the side 102 the pins 310 are soldered or otherwise conductively attached to corresponding via contact pads 106. In FIG. 2, then, the visible pins 310 includes pins 310A, 310B, and 310C extending through the vias 104D, 104E, and 104F, respectively, and soldered to the via contact pads 106D, 106E, and 106F. By comparison, the surface mount contact pads 108 are receptive to soldering or other conductive attachment of a surface-mount device (SMD) 308, such as a decoupling capacitor.

FIG. 3 shows another example of a portion of the electronic device 300 including the circuit board 100. The device 300 is depicted in FIG. 3, as in FIG. 2, as a front cross-sectional view across a plane intersecting the vias 104D, 104E, and 104F. The circuit board 100 includes the substrate 302 that has opposing sides 304 and 102. Visible in FIG. 3 are, besides the 104D, 104E, and 104F, the via contact pads 106D, 106E, and 106F, and the surface mount contact pads 108. The vias 104 extend through the substrate 302 from the side 304 to the side 102. The vias 104 may be filled with a conductive material 358.

On the side 304 of the substrate 302 are additional via contact pads 354A, 354B, and 354C, collectively referred to as the via contact pads 354, and which correspond to the via contact pads 106D, 106E, and 106F on the other side 102 of the substrate 302. The via contact pads 354 surround the vias 104 on the side 304 in the same manner that the via contact pads 106 surround the vias 104 on the side 102. In the implementation of FIG. 3, which is known as via-in-pad plated over (VIPPO) technology, BGA package 352 is conductively attached to the via contact pads 354 via corresponding solder balls 356A, 356B, and 356C, collectively referred to as the solder balls 356. However, in another implementation, the BGA package 352 may not be directly conductively attached to the via contact pads 354 via the solder balls 356. Rather, traces on the side 304 may extend from the via contact pads 354 to other contact pads that are directly conductively attached to the BGA package 352 via the solder balls 352. In either case, as in FIG. 2, the surface mount contact pads 108 are receptive to conductive attachment of the SMD 308.

FIG. 4 shows an example method 400 for manufacturing the circuit board 100 that has been described. The substrate 302 of the circuit board 100 is provided (402). The vias 104 are formed through the substrate 302 from the side 304 to the side 102 and can also be filled with a conductive material 358 (404). The via contact pads 106 are formed surrounding the vias 104 on the side 102, and the via contact pads 354 can be similarly formed surrounding the vias 104 on the side 304 (406), and likewise the surface mount contact pads 108 are formed on the side 102 (408). The surface mount contact pads 108 have edges to maximize the pad surface area, while maintaining specified minimum distances between one another and in relation to the via contact pads 106.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A circuit board comprising:
a substrate having a first side and a second side opposite the first side;
a plurality of vias extending through the substrate from the first side to the second side;
a plurality of via contact pads on the second side, each via contact pad surrounding a corresponding via; and
a pair of surface mount contact pads on the second side, each surface mount contact pad having a surface area and one or more first edges adjacently opposite corresponding via contact pads, each first edge having a shape to maximize the surface area while maintaining a first predetermined minimum distance to a closet via contact pad,
wherein the shape of each first edge is a same shape as a shape of an opposite portion of the closest via contact pad, a distance between each point of a plurality of points of the first edge and a closest point of a plurality of points of the opposite portion of the closest via contact pad being equal to the first predetermined distance.

2. The circuit board of claim 1, wherein each first edge has a curved shape.

3. The circuit board of claim 2, wherein the curved shape is a partially circular shape.

4. The circuit board of claim 2, wherein the curved shape is concave.

5. The circuit board of claim 1, wherein each surface mount contact pad further has one or more second edges not adjacently opposite the corresponding via contact pads nor to the other surface mount contact pad, each second edge having a shape to maximize the surface area of the surface mount contact pad while maintaining the first predetermined minimum distance to each via contact pad.

6. The circuit board of claim 5, wherein each second edge has a curved shape.

7. The circuit board of claim 6, wherein the curved shape is a partially circular shape.

8. The circuit board of claim 6, wherein the curved shape is convex.

9. The circuit board of claim 1, wherein each surface mount contact pad further has a third edge opposite the other surface mount contact pad of the pair and having a shape to maximize the surface area of the surface mount contact pad while maintaining a second predetermined minimum distance to the other surface mount contact pad.

10. The circuit board of claim 9, wherein each third edge has a linear shape.

11. The circuit board of claim 1, wherein each surface mount contact pad is located on the second side in an area bounded by four of the vias organized in a two via-by-two via grid.

12. The circuit board of claim 1, wherein at least one surface mount contact pad is substantially octagonal in shape.

13. A method comprising: providing a substrate of a circuit board, the substrate having a first side and a second side opposite the first side; forming a plurality of vias extending through the substrate from the first side to the second side; fabricating a plurality of via contact pads on the second side, each via contact pad surrounding a corresponding via; and fabricating a pair of surface mount contact pads on the second side, each surface mount contact pad having: a plurality of first edges adjacently opposite corresponding via contact pads and having curved shapes; a plurality of second edges not adjacently opposite the corresponding via contact pads and having curved shapes; and a third edge opposite the other surface mount contact pad and having a linear shape, wherein the shape of each first edge is a same shape as a shape of an opposite portion of a closest via contact pad, a distance between each point of a plurality of points of the first edge and a closest point of a plurality of points of the opposite portion of the closest via contact pad being equal to a predetermined distance.

14. The method of claim 13, wherein the curved shape of each first edge is a partially circular shape.

15. The method of claim 13, wherein the curved shape of each first edge is concave.

16. The method of claim 13, wherein the curved shape of each second edge is a partially circular shape.

17. The method of claim 13, wherein the curved shape of each second edge is convex.

18. An electronic device comprising:
a substrate having a first side and a second side opposite the first side;
a plurality of vias extending through the substrate from the first side to the second side;
a plurality of via contact pads on the second side, each via contact pad surrounding a corresponding via;
a plurality of surface mount contact pads on the second side, each surface mount contact pad having a plurality of edges, each edge except one or more edges that are opposite another surface mount contact pad having a curved shape, each edge opposite another surface mount contact pad having a linear shape;
one or more electrical components disposed on one or more of the first side and the second side; and
one or more surface mount electrical components disposed on the surface mount contact pads on the second side,
wherein the shape of each edge except the one or more edges is a same shape as a shape of an opposite portion of a closest via contact pad, a distance between each point of a plurality of points of the edge and a closest point of a plurality of points of the opposite portion of the closest via contact pad being equal to a predetermined distance.

19. The electronic device of claim 18, wherein at least one surface mount contact pad is substantially octagonal in shape.

20. The electronic device of claim 18, wherein the curved shape of each edge opposite a corresponding via contact pad curves inwardly, and the curved shape of each edge not opposite a corresponding via contact pad and not opposite another surface mount contact pad curves outwardly.

* * * * *